United States Patent
Jang et al.

(10) Patent No.: US 10,476,433 B2
(45) Date of Patent: Nov. 12, 2019

(54) MICROWAVE GENERATOR WITH POWER FACTOR CORRECTION FUNCTION AND CONTROL METHOD THEREOF

(71) Applicant: DELTA ELECTRONICS, INC., Taoyuan (TW)

(72) Inventors: Yungtaek Jang, Taoyuan (TW); Yin-Yuan Chen, Taoyuan (TW); Sheng-Hua Li, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 218 days.

(21) Appl. No.: 15/632,076

(22) Filed: Jun. 23, 2017

(65) Prior Publication Data

US 2018/0013385 A1 Jan. 11, 2018

Related U.S. Application Data (60) Provisional application No. 62/358,313, filed on Jul. 5, 2016.

(51) Int. Cl.
*H03B 5/18* (2006.01)
*H03B 5/04* (2006.01)
(Continued)

(52) U.S. Cl.
CPC ............. *H03B 5/04* (2013.01); *G05F 1/70* (2013.01); *H03B 5/02* (2013.01); *H03B 5/1847* (2013.01);
(Continued)

(58) Field of Classification Search
CPC .. H03B 5/1847; H03B 5/02; H03B 2200/003; G05F 1/70; H03K 3/00; H03K 4/06; H03K 4/08; H03K 7/02; H03K 7/06
(Continued)

(56) References Cited

U.S. PATENT DOCUMENTS

2016/0164423 A1* 6/2016 Lidstrom ............ H02M 1/4258
363/21.02

FOREIGN PATENT DOCUMENTS

CN          103117654 A          5/2013
JP          WO2018003152    *    4/2018   ............... H05B 6/66

OTHER PUBLICATIONS

Imtiaz et al., "An Integrated Inverse-F Power Amplifier Design Approach for Heating Applications in a Microwave Resonant Cavity", Proceedings of Asia-Pacific Microwave Conference 2014, pp. 756-758 (Year: 2014).*

(Continued)

*Primary Examiner* — Benny T Lee
*Assistant Examiner* — Hafizur Rahman
(74) *Attorney, Agent, or Firm* — Kirton McConkie; Evan R. Witt (57) ABSTRACT

A microwave generator includes a power supply, an output circuit, a feedback oscillator, a pulse controller, a signal combination circuit and a semiconductor amplifier. The power supply converts input voltage and input current into output voltage and output current. The output circuit generates a microwave signal to an output terminal of the microwave generator and a feedback signal according to the microwave signal. The feedback oscillator generates an oscillation signal according to the feedback signal. According to a reference signal, the pulse controller generates a pulse signal. According to the oscillation signal and pulse signal, the signal combination circuit generates a control signal. The semiconductor amplifier generates and adjusts an amplified signal according to the control signal. The output circuit generates the microwave signal according to the amplified signal. The output current is adjusted according to the amplified signal. Consequently, the input current and the input voltage are in phase.

12 Claims, 11 Drawing Sheets

(51) Int. Cl.
| | |
|---|---|
| *G05F 1/70* | (2006.01) |
| *H03B 5/02* | (2006.01) |
| *H03K 3/00* | (2006.01) |
| *H03K 4/06* | (2006.01) |
| *H03K 4/08* | (2006.01) |
| *H03K 7/02* | (2006.01) |
| *H03K 7/06* | (2006.01) |

(52) U.S. Cl.
CPC ............... *H03K 3/00* (2013.01); *H03K 4/06* (2013.01); *H03K 4/08* (2013.01); *H03K 7/02* (2013.01); *H03K 7/06* (2013.01); *H03B 2200/003* (2013.01)

(58) Field of Classification Search
USPC ........ 333/246; 327/16, 17, 40, 74, 101, 128, 327/131; 330/140, 260, 265, 270, 291; 331/44, 96
See application file for complete search history.

(56) References Cited

OTHER PUBLICATIONS

Woo et al., "One-Chip Class-E Inverter Controller for Driving a Magnetron", IEEE Transactions on Industrial Electronics, vol. 56, No. 2, Feb. 2009, pp. 400-407 (Year: 2009).*

\* cited by examiner

MICROWAVE GENERATOR WITH POWER FACTOR CORRECTION FUNCTION AND CONTROL METHOD THEREOF

CROSS-REFERENCE TO RELATED APPLICATION

This application claims the benefit of U.S. Provisional Application No. 62/358,313 filed on Jul. 5, 2016, and entitled "POWER SUPPLY WITH POWER FACTOR CONTROL", the entirety of which is hereby incorporated by reference.

FIELD OF THE INVENTION

The present invention relates to a microwave generator, and more particularly to a microwave generator with a power factor correction function and a control method thereof.

BACKGROUND OF THE INVENTION

Generally, a microwave apparatus or a RF wireless apparatus needs a microwave generator to generate a microwave signal.

The microwave generator is usually equipped with a power supply. The power supply is used for converting an input voltage and an input current into required output electric power. The output electric power is provided to the corresponding circuitry of the microwave generator. Consequently, the microwave generator can normally generate the microwave signal. For achieving the power factor correction function, the power supply of the microwave generator has a two-stage configuration. That is, the power supply of the microwave generator comprises a power factor correction circuit and a power converter. The power factor correction circuit is used for causing the input current received by the power supply to follow a sinusoidal waveform in phase with the input voltage so as to correct the power factor of the power supply and reduce the harmonics. The power converter is used for converting the electric power outputted from the power factor correction circuit into an output voltage and output current.

By the power factor correction circuit, the input current and the input voltage are in phase. However, since the power factor correction circuit is costly, the use of the power factor correction circuit increases the fabricating cost and the volume of the microwave generator.

Therefore, there is a need of providing a microwave generator with a power factor correction function and a control method thereof in order to overcome the above drawbacks.

SUMMARY OF THE INVENTION

The present invention provides a microwave generator with a power factor correction function and a control method thereof. The microwave generator is not equipped with a power factor correction circuit. Consequently, the fabricating cost and the volume of the microwave generator are reduced.

In accordance with an aspect of the present invention, there is provided a microwave generator. The microwave generator includes a power supply, an output circuit, a feedback oscillator, a pulse controller, a signal combination circuit and a semiconductor amplifier. The power supply is used for converting an input voltage and an input current into an output voltage and an output current. The output circuit is connected with an output terminal of the microwave generator. The output circuit generates a microwave signal to the output terminal and generates a feedback signal according to the microwave signal. The feedback oscillator is electrically connected with the output circuit. Moreover, the feedback oscillator generates an oscillation signal according to the feedback signal. The pulse controller receives a reference signal related to the input voltage and/or harmonics of the input voltage and generates a pulse signal. The signal combination circuit combines the oscillation signal with the pulse signal to generate a control signal. The semiconductor amplifier is electrically connected with the power supply, the signal combination circuit and the output circuit. The semiconductor amplifier receives the output voltage and the output current, generates and adjusts an amplified signal according to the control signal. The output circuit generates the microwave signal according to the amplified signal, and the output current is adjusted according to the amplified signal. Consequently, the input current and the input voltage are in phase.

In accordance with another aspect of the present invention, there is provided a microwave generator. The microwave generator includes a power supply, an output circuit, a feedback oscillator, a splitter, a pulse controller, plural signal combination circuits and plural semiconductor amplifiers. The power supply converts an input voltage and an input current into an output voltage and an output current. The output circuit is connected with an output terminal of the microwave generator. The output circuit generates a microwave signal to the output terminal and generates a feedback signal according to the microwave signal. The feedback oscillator is electrically connected with the output circuit. Moreover, the feedback oscillator generates an oscillation signal according to the feedback signal. The splitter is electrically connected with the feedback oscillator for splitting the oscillation signal into plural segmented oscillation signals. The pulse controller receives a reference signal related to the input voltage and/or harmonics of the input voltage and generates a pulse signal. The plural signal combination circuits combine the corresponding segmented oscillation signal with the pulse signal to generate a control signal. The plural semiconductor amplifiers are electrically connected with the power supply, the corresponding signal combination circuits and the output circuit. Each semiconductor amplifier receives the output voltage and the output current, generates and adjusts an amplified signal according to the control signal. The output circuit generates the microwave signal according to the amplified signals outputted from the plural semiconductor amplifiers, and the output current is adjusted according to the amplified signals outputted from the plural semiconductor amplifiers. Consequently, the input current and the input voltage are in phase.

In accordance with a further aspect of the present invention, there is provided a control method for a microwave generator. The microwave generator outputs a microwave signal and includes a power supply, a pulse controller, an output circuit, a feedback oscillator, a signal combination circuit and a semiconductor amplifier. The control method includes the following steps. Firstly, the power supply converts an input voltage and an input current into an output voltage and an output current, and provides the output voltage and the output current to the semiconductor amplifier. Then, the output circuit generates the microwave signal and generates a feedback signal according to the microwave signal. Then, the feedback oscillator generates an oscillation signal according to the feedback signal. Then, a reference signal related to the input voltage and/or harmonics of the input voltage is provided to the pulse controller. Consequently, the pulse controller generates a pulse signal according to the reference signal. Then, the signal combination circuit generates a control signal according to the oscillation signal and the pulse signal. Then, the semiconductor amplifier generates and adjusts an amplified signal according to the control signal, and the output circuit generates the microwave signal according to the amplified signal. Consequently, the output current is adjusted according to the amplified signal, and the input current and the input voltage are in phase.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
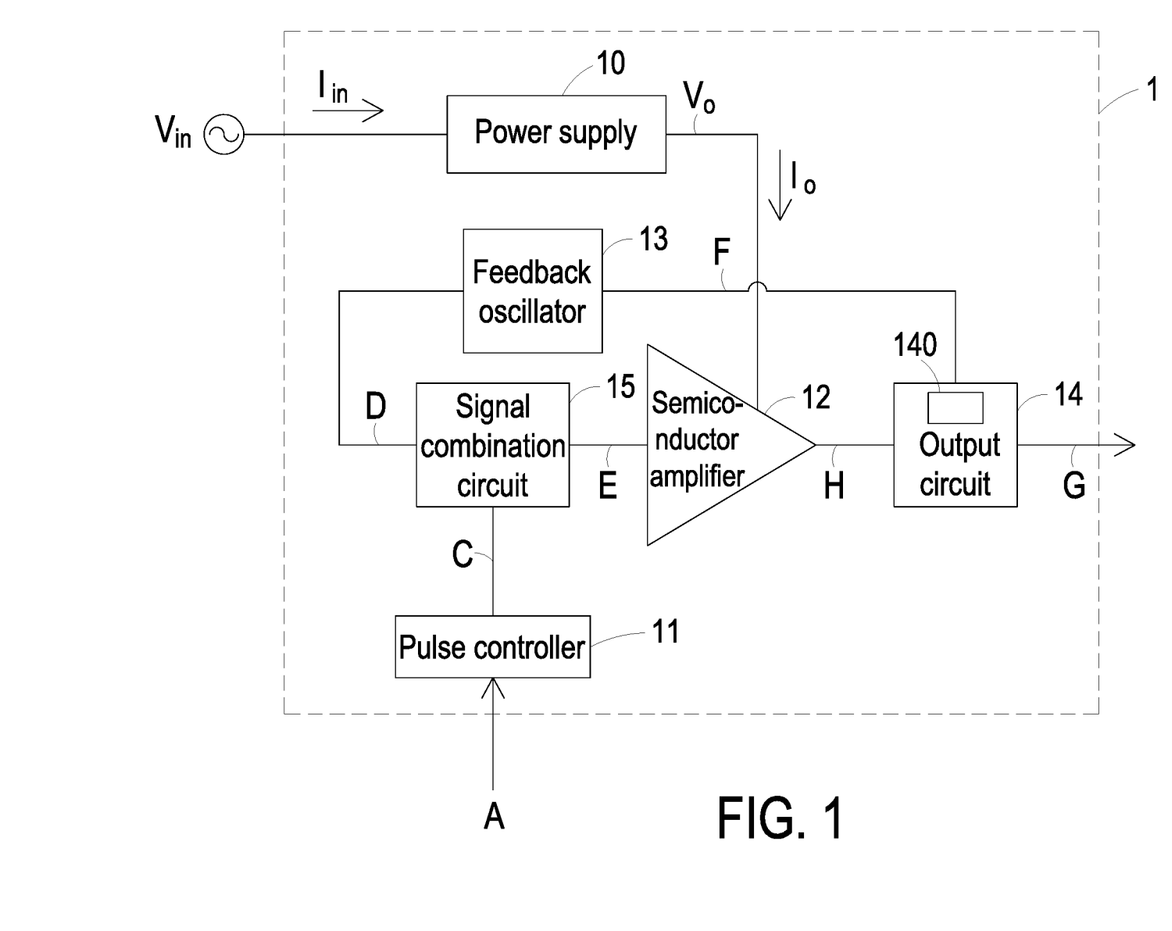
FIG. 1 is a schematic circuit block diagram illustrating the architecture of a microwave generator according to a first embodiment of the present invention.

FIG. 1 is a schematic circuit block diagram illustrating the architecture of a microwave generator according to a first embodiment of the present invention. The microwave generator 1 is applied to a microwave apparatus (e.g., a microwave oven) or a RF wireless apparatus. The microwave generator 1 is used for generating a microwave signal G. In this embodiment, the microwave generator 1 comprises a power supply 10, a pulse controller 11, a semiconductor amplifier 12, a feedback oscillator 13, an output circuit 14 and a signal combination circuit 15.

In accordance with the present invention, the power supply 10 has a single-stage configuration. That is, the power supply 10 comprises a power converter. The power supply 10 is used for converting an input voltage Vin and an input current Iin into an output voltage Vo and an output current Io. In an embodiment, the output voltage Vo is maintained at a rated value by the power supply 10. In case that the input voltage Vin and the input current Iin are AC power, the power converter of the power supply 10 usually comprises a bridge-type rectifier for rectifying the input voltage Vin and the input current Iin.

The output circuit 14 is electrically connected with an output terminal of the microwave generator 1. The output circuit 14 is used for generating the microwave signal G. In addition, the output circuit 14 generates a feedback signal F according to the frequency or the amplitude of the microwave signal G. The feedback oscillator 13 is electrically connected with the output circuit 14. According to the feedback signal F, the feedback oscillator 13 generates a high-frequency oscillation signal D. A reference signal A related to the input voltage Vin and/or harmonics of the input voltage is received by the pulse controller 11. According to the reference signal A, the pulse controller 11 generates a pulse signal C with a specified duty cycle.

The signal combination circuit 15 is electrically connected with the feedback oscillator 13 for receiving the oscillation signal D from the feedback oscillator 13. The signal combination circuit 15 is also electrically connected with the pulse controller 11 for receiving a pulse signal C from the pulse controller 11. After the oscillation signal D and the pulse signal C are combined together by the signal combination circuit 15, a control signal E is generated.

The semiconductor amplifier 12 is electrically connected with the power supply 10, the signal combination circuit 15 and the output circuit 14. The semiconductor amplifier 12 receives the output voltage Vo and the output current Io from the power supply 10 and served as a power amplifier. Moreover, the semiconductor amplifier 12 generates and adjusts the amplified signal H according to the control signal E, and the output circuit 14 generates the microwave signal G according to the amplified signal H. An example of the semiconductor amplifier 12 includes but is not limited to a lateral diffusion metal oxide semiconductor (LDMOS) or a gallium nitride high electron mobility transistor (GaN HEMT). Moreover, the gate terminal of the semiconductor amplifier 12 is electrically connected with the signal combination circuit 15, the drain terminal of the semiconductor amplifier 12 is electrically connected with the power supply 10. The source terminal of the semiconductor amplifier 12 is electrically connected with a ground terminal (not shown).

As mentioned above, the output circuit 14 generates the feedback signal F according to the microwave signal G. The oscillation signal D from the feedback oscillator 13 is related with the feedback signal F. Moreover, after the oscillation signal D and the pulse signal C are combined together by the signal combination circuit 15, the control signal E is generated. While the semiconductor amplifier 12 is operated according to the control signal E, the amplified signal H from the semiconductor amplifier 12 is dynamically adjusted according to the feedback signal F. Accordingly, the microwave signal G from the output circuit 14 are also adjusted. For example, the frequency of the microwave signal G is adjusted.

The reference signal A is related to the input voltage Vin and/or harmonics of the input voltage, and the pulse signal C is generated by the pulse controller 11 according to the reference signal A. Moreover, the control signal E is generated by the signal combination circuit 15 according to the oscillation signal D and the pulse signal C. The amplified signal H is generated by the semiconductor amplifier 12 according to the control signal E, and the microwave signal G is generated by the output circuit 14 according to the amplified signal H. Moreover, the amplified signal H is related with the input voltage Vin. While the output current Io from the power supply 10 is adjusted according to the amplified signal H, the output current Io is also adjusted according to the input voltage Vin. Hence the input current Iin is adjusted to be in phase with the input voltage Vin according to the adjustment of the output current Io. Even if the power supply 10 of the microwave generator 1 is not equipped with a power factor correction circuit, the power factor correction is achieved. Consequently, the fabricating cost and the volume of the microwave generator 1 are reduced.

In an embodiment, as shown in FIG. 1, the output circuit 14 includes a detecting circuit 140. The detecting circuit 140 is electrically connected with the feedback oscillator 13 and the output terminal of the output circuit 14 for generating the feedback signal F according to the microwave signal G, for example the reflected power from the microwave signal G. Consequently, the frequency of the microwave signal G outputted from the output circuit 14 is adjusted. In addition, if the semiconductor amplifier 12 belongs to the class-E or class-F amplifier, the microwave generator 1 further comprises a radio frequency choke between the power supply 10 and the drain terminal of the semiconductor amplifier 12, and the output circuit 14 further includes an impedance matching circuit (not shown) and a resonant circuit (not shown). The impedance matching circuit and the resonant circuit of the output circuit 14 are used for generating required microwave signal G according to the amplified signal H. The structures, operations and functions of the impedance matching circuit and the resonant circuit are well-known in the RF art, and are not redundantly described herein.

In an embodiment, the input voltage Vin is a sinusoidal AC voltage. The magnitude of the input voltage Vin is in the range between 110V and 230V, and the magnitude of the output voltage Vo is 30V. Under this circumstance, the power supply 10 is a buck power converter or an isolated converter with a transformer. Since the input voltage Vin is the sinusoidal AC voltage, the input voltage Vin is expressed as Vpk×sin(ωt), wherein Vpk is a peak value of the input voltage. Preferably but not exclusively, the power supply 10 has the circuitry of a LLC power converter.

Figure 2:
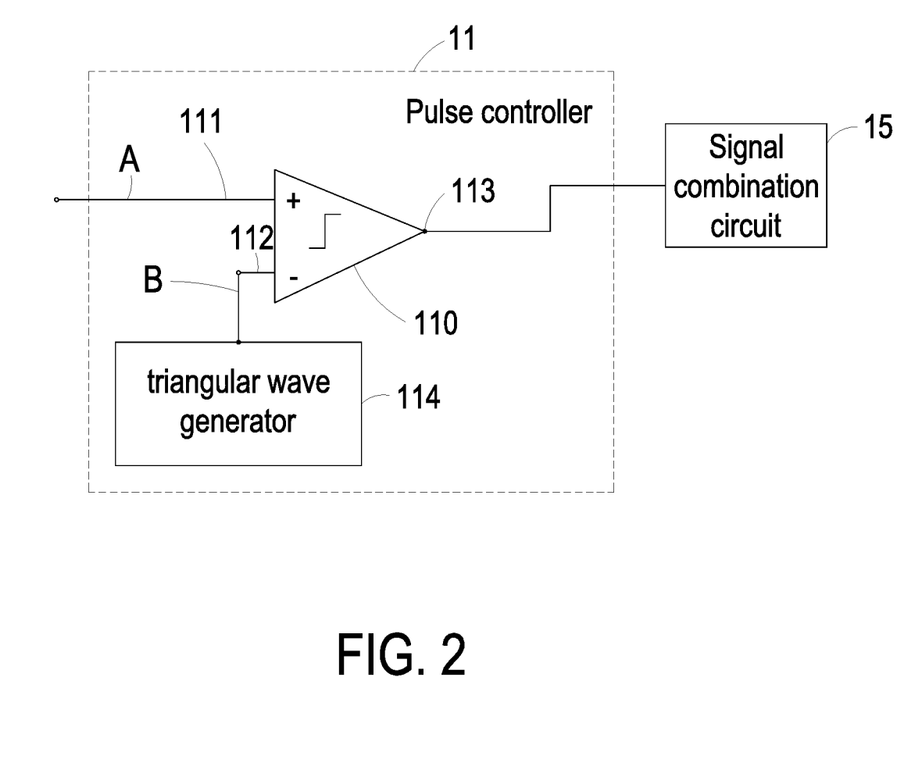
FIG. 2 is a schematic circuit block diagram illustrating the pulse controller of the microwave generator as shown in FIG. 1.

FIG. 2 is a schematic circuit block diagram illustrating the pulse controller of the microwave generator as shown in FIG. 1. As shown in FIG. 2, the pulse controller 11 comprises a comparator 110 and a triangular wave generator 114. The triangular wave generator 114 is used for generating a triangular wave signal B. The comparator 110 comprises a first input terminal 111, a second input terminal 112 and an output terminal 113. The first input terminal 111 receives the reference signal A. The second input terminal 112 is electrically connected with the triangular wave generator 114 so as to receive the triangular wave signal B. The output terminal 113 is electrically connected with the signal combination circuit 15. According to the result of comparing the reference signal A with the triangular wave signal B, the comparator 110 generates the pulse signal C to the output terminal 113. Moreover, the pulse signal C is further transmitted to the signal combination circuit 15 through the output terminal 113. From the above descriptions, the pulse controller 11 is implemented by a general PWM module. Alternatively, the pulse controller 11 can also be implemented by other ways, for example a digital way.

Figure 3:
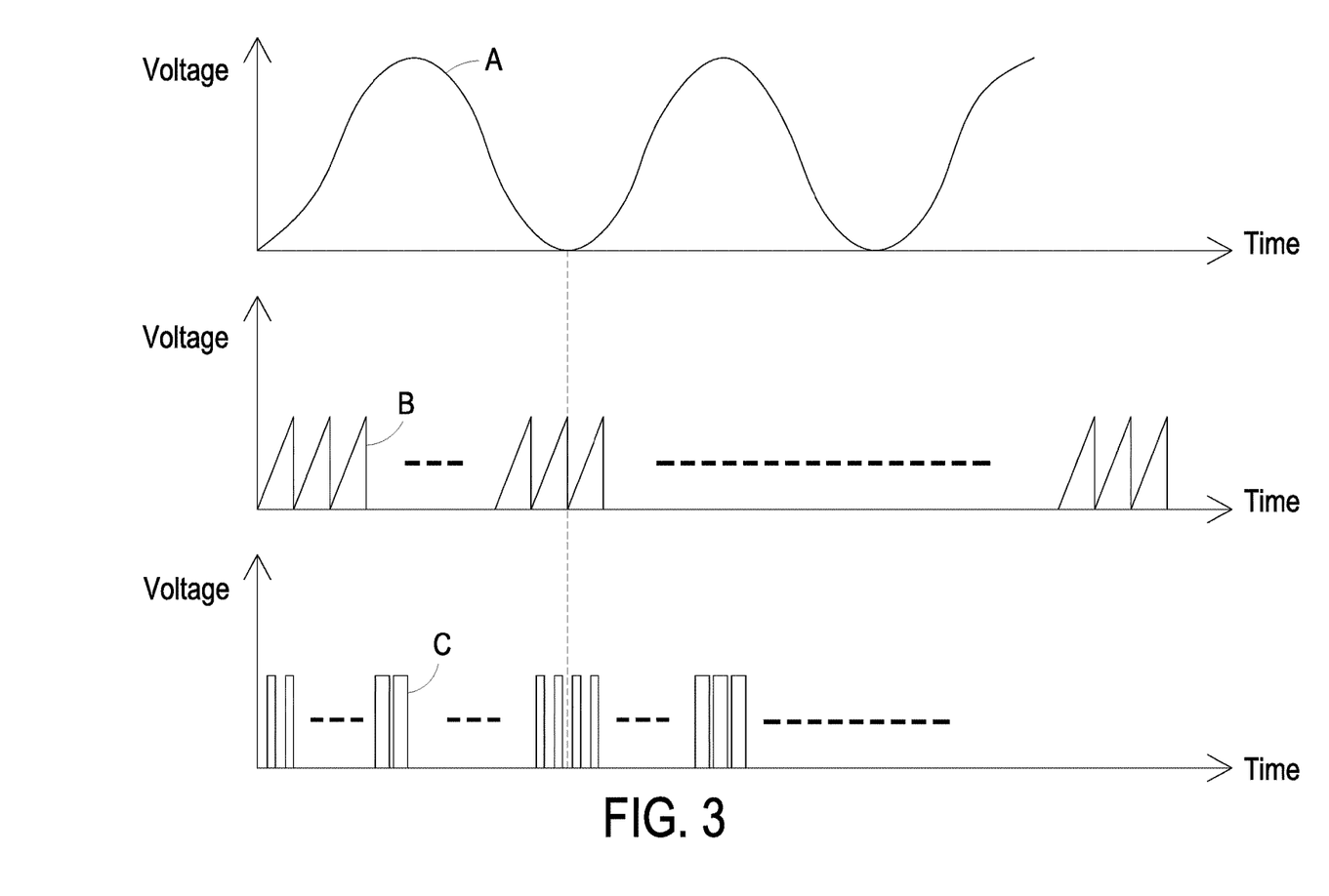
FIG. 3 is a schematic timing waveform diagram illustrating the reference signal, the triangular wave signal and the pulse signal processed by the pulse controller of the microwave generator according to the first embodiment of the present invention.

FIG. 3 is a schematic timing waveform diagram illustrating the reference signal, the triangular wave signal and the pulse signal processed by the pulse controller of the microwave generator according to the first embodiment of the present invention. Please refer to FIGS. 1, 2 and 3. If the voltage level of the reference signal A is higher than the voltage level of the triangular wave signal B, the pulse signal C in a high level state is outputted from the comparator 110 to the output terminal 113. Whereas, if the voltage level of the triangular wave signal B is higher than the voltage level of the reference signal A, the pulse signal C in a low level state is outputted from the comparator 110 to the output terminal 113.

Figure 4:
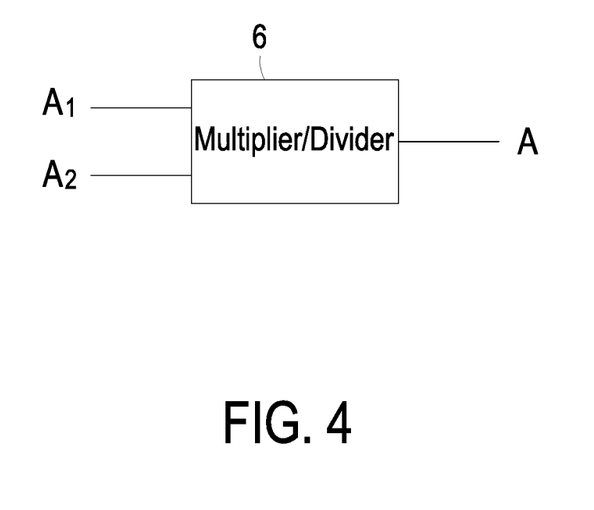
FIG. 4 schematically illustrates a multiplier/divider for generating the reference signal.

FIG. 4 schematically illustrates a multiplier/divider for generating the reference signal. As shown in FIG. 4, a multiplier/divider 6 is used for multiplying a first reference value A1 and a second reference value A2 and dividing the product of the first reference value A1 and the second reference value A2 by a predetermined value Vavg. The first reference value A1 is obtained by using a first voltage sampler (not shown) to sample the input voltage Vin. The first reference value A1 is expressed as: A1=K1×|Vin|, wherein K1 is a first proportion coefficient. Similarly, the second reference value A2 is obtained by using a second voltage sampler (not shown) to sample the input voltage Vin. The second reference value A2 is expressed as: A2=K2×|Vin|, wherein K2 is a second proportion coefficient. The predetermined value Vavg is equal to an average value of the rectified voltage from the bridge-type rectifier of the power supply 10. After the associated operations are performed on the first reference value A1, the second reference value A2 and the predetermined value Vavg, the multiplier/divider 6 generates the reference signal. The reference signal A is expressed as: A=K1×K2×|Vin|$^2$/Vavg. Moreover, the first reference value A1 can be also expressed as: A1=K1×|Vpk×Sin(ωt)|, and the second reference value A2 can be also expressed as: A2=K2×|Vpk×Sin(ωt)|. Consequently, the reference signal A is also expressed as: A=K1×K2×(Vpk)$^2$×Sin$^2$(ωt)/Vavg. That is, the product of K1 and K2 is another proportion coefficient. As mentioned above, the reference signal A is related with the input voltage Vin, and the input voltage Vin is the sinusoidal AC voltage with alternately positive and negative values. Hence the use of the reference signal A can let the comparator 110 to output a PWM signal related to the square of the input voltage Vin. It should be noted that the coefficient can be also related to harmonics of the input voltage. It is noted that the first voltage sampler and the second voltage sampler can be a digital voltage sampling device or an analog voltage sampling device, respectively.

Figure 5:
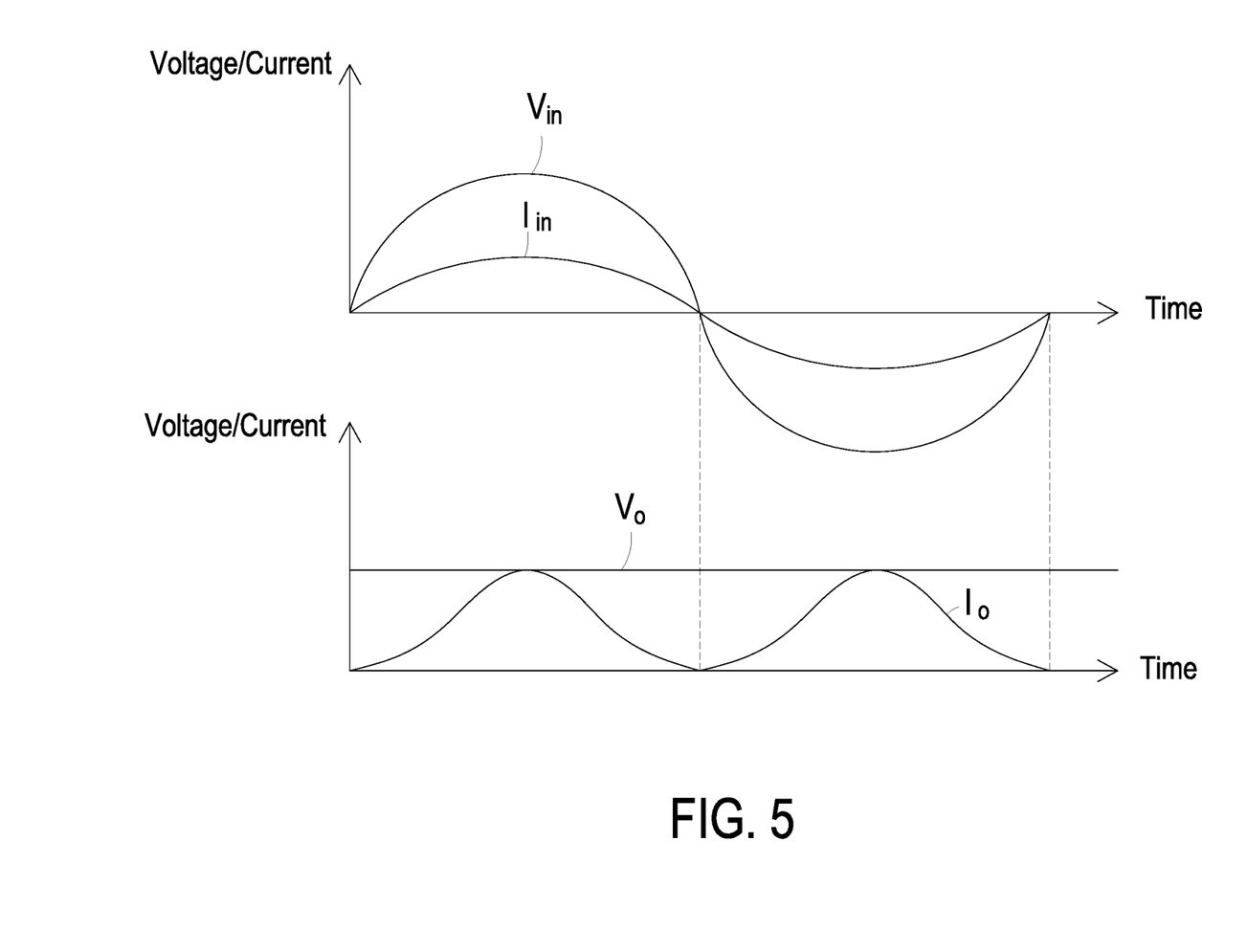
FIG. 5 is a schematic timing waveform diagram illustrating the relationships between the input voltage, the input current, the output voltage and the output current of the microwave generator according to the first embodiment of the present invention.

FIG. 5 is a schematic timing waveform diagram illustrating the relationships between the input voltage, the input current, the output voltage and the output current of the microwave generator according to the first embodiment of the present invention. The average level of the output current Io actually matches with the waveform of Io as shown in FIG. 5. Without considering the power loss, the output power is equal to the input power based on the law of energy conservation. Accordingly, the input current Iin is adjusted according to the adjustment of the output current Io. The reference signal A is related to the input voltage Vin and/or harmonics of the input voltage, and the pulse signal C is generated by the pulse controller 11 according to the reference signal A. Moreover, the control signal E is generated by the signal combination circuit 15 according to the oscillation signal D and the pulse signal C. The amplified signal H is generated by the semiconductor amplifier 12 according to the control signal E, and the microwave signal G is generated by the output circuit 14 according to the amplified signal H. Moreover, the amplified signal H is related with the input voltage Vin. While the output current Io from the power supply 10 is adjusted according to the amplified signal H, the output current Io is also adjusted according to the input voltage Vin. Since the input current Iin is adjusted according to the output current Io, the input current Iin and the input voltage Vin are adjusted to be in phase.

Figure 6:
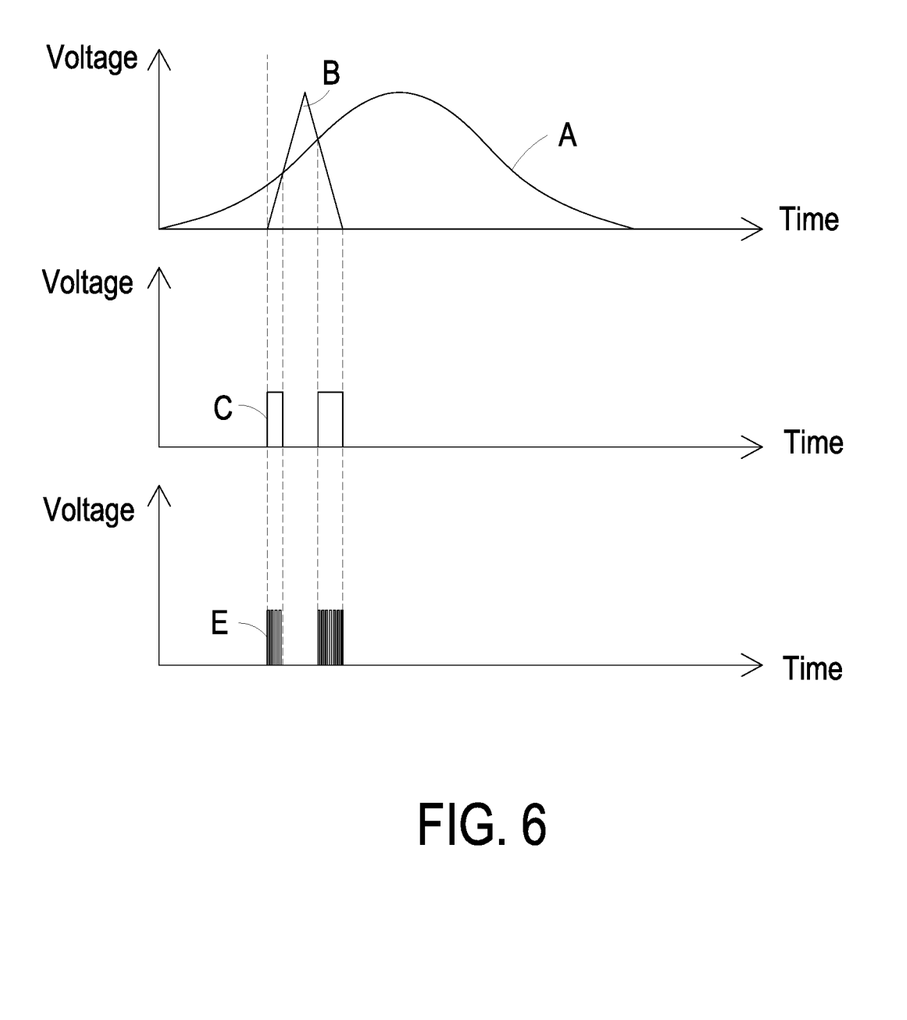
FIG. 6 is a schematic timing waveform diagram illustrating the relationships between the reference signal, the triangular wave signal, the pulse signal and the microwave signal of the microwave generator according to the first embodiment of the present invention.
Figures 7A, 7B:
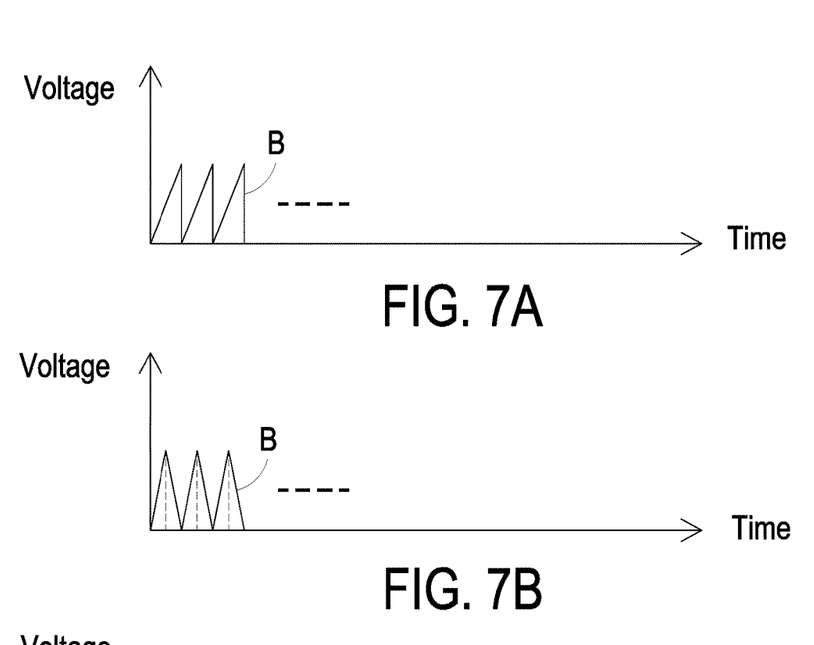
FIGS. 7A, 7B and 7C schematically illustrate some exemplary waveforms of the triangular wave signal that is generated by the triangular wave generator of the microwave generator according to the first embodiment of the present invention.
Figure 7C:
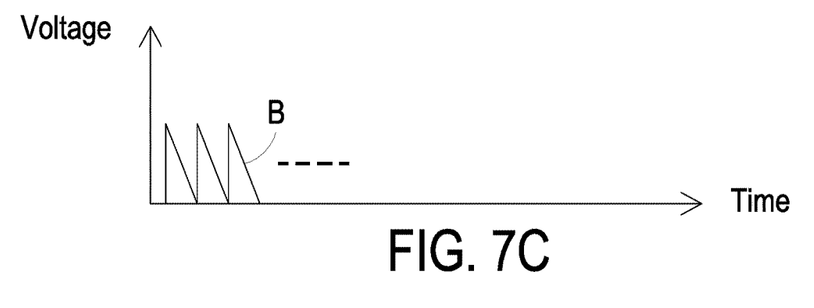

FIG. 6 is a schematic timing waveform diagram illustrating the relationships between the reference signal, the triangular wave signal, the pulse signal and the microwave signal of the microwave generator according to the first embodiment of the present invention. As mentioned above, the comparator 110 generates the pulse signal C according to the result of comparing the reference signal A with the triangular wave signal B. If the voltage level of the reference signal A is higher than the voltage level of the triangular wave signal B, the pulse signal C in a high level state is outputted from the comparator 110. Meanwhile, the control signal E is generated by the signal combination circuit 15 according to the oscillation signal D and the pulse signal C. The amplified signal H is generated by the semiconductor amplifier 12 according to the control signal E, and the microwave signal G is generated by the output circuit 14 according to the amplified signal H. Since the oscillation signal D is the microwave and the frequency of the oscillation signal D is higher than the frequency of the pulse signal C, the waveform of the control signal E is shown in FIG. 6. The triangular wave signal from the triangular wave generator 114 of FIG. 2 has various waveforms. FIGS. 7A, 7B and 7C schematically illustrate some exemplary waveforms of the triangular wave signal that is generated by the triangular wave generator of the microwave generator according to the first embodiment of the present invention. In the triangular wave signal of FIG. 7A, the voltage level gradually increases from zero to a peak value and then abruptly decreases to zero. In the triangular wave signal of FIG. 7B, the voltage level gradually increases from zero to a peak value and then gradually decreases to zero. In the triangular wave signal of FIG. 7C, the voltage level abruptly increases from zero to a peak value and then gradually decreases to zero.

Figure 8:
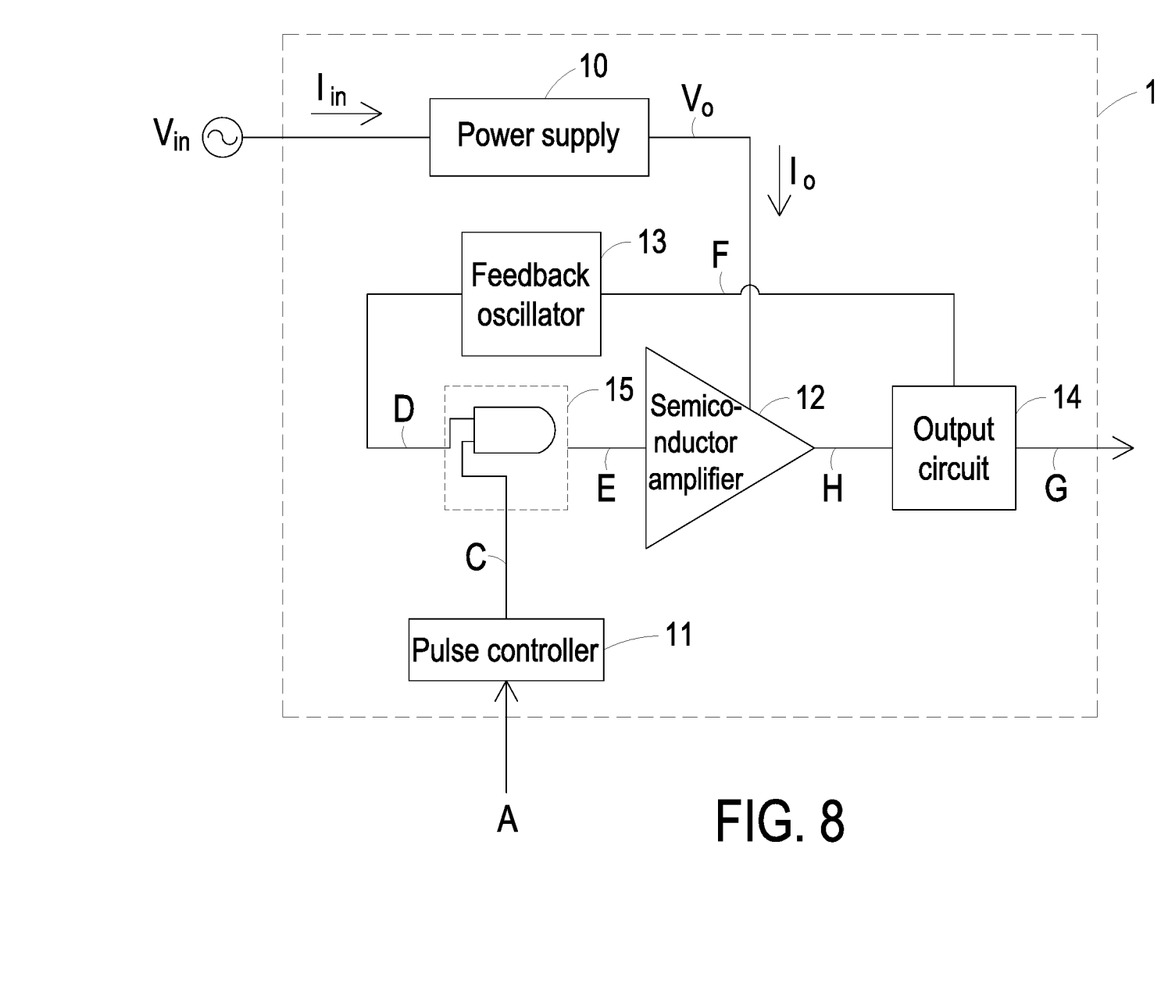
FIG. 8 is a schematic circuit block diagram illustrating an exemplary signal combination circuit of the microwave generator of FIG. 1.

FIG. 8 is a schematic circuit block diagram illustrating an exemplary signal combination circuit of the microwave generator of FIG. 1. In this embodiment, the signal combination circuit 15 performs an AND function. Preferably the signal combination circuit 15 is an AND gate. A first input terminal of the AND gate is electrically connected with the feedback oscillator 13 to receive the oscillation signal D. A second input terminal of the AND gate is electrically connected with the pulse controller 11 to receive the pulse signal C. An output input terminal of the AND gate is electrically connected with the semiconductor amplifier 12. After the oscillation signal D and the pulse signal C are combined together by the AND gate, the control signal E is generated to the semiconductor amplifier 12. Alternatively, the signal combination circuit 15 can be a high-speed switching device. The high-speed switching device is controlled by the pulse signal C to pass the oscillation signal D selectively.

Figure 9:
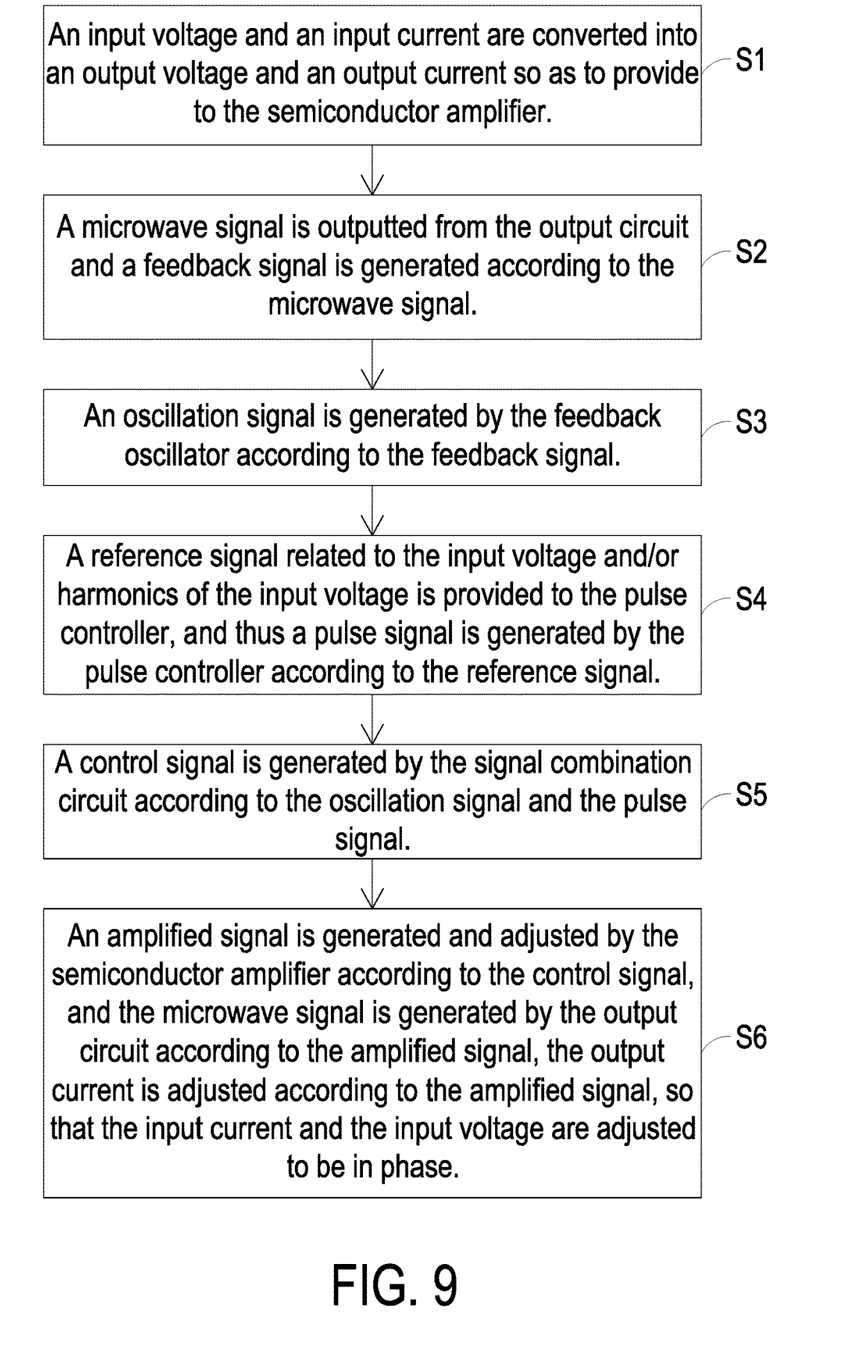
FIG. 9 is a flowchart illustrating a control method of the microwave generator according to the first embodiment of the present invention.

FIG. 9 is a flowchart illustrating a control method of the microwave generator according to the first embodiment of the present invention. Firstly, in a step S1, an input voltage Vin and an input current Iin are respectively converted into an output voltage Vo and an output current Io by the power supply 10 so as to provide to the semiconductor amplifier 12. In a step S2, a microwave signal G is outputted from the output circuit 14 and a feedback signal F is generated according to the microwave signal G. In a step S3, an oscillation signal D is generated by the feedback oscillator 13 according to the feedback signal F. In a step S4, a reference signal A related to the input voltage Vin and/or harmonics of the input voltage is provided to the pulse controller 11, and thus a pulse signal C is generated. In a step S5, a control signal E is generated by the signal combination circuit 15 according to the oscillation signal D and the pulse signal C. In a step S6, the amplified signal H is generated and adjusted by the semiconductor amplifier 12 according to the control signal E, and the microwave signal G is generated by the output circuit 14 according to the amplified signal H. Since the output current Io is adjusted according to the amplified signal H, the input current Iin and the input voltage Vin are adjusted to be in phase.

Figure 10:
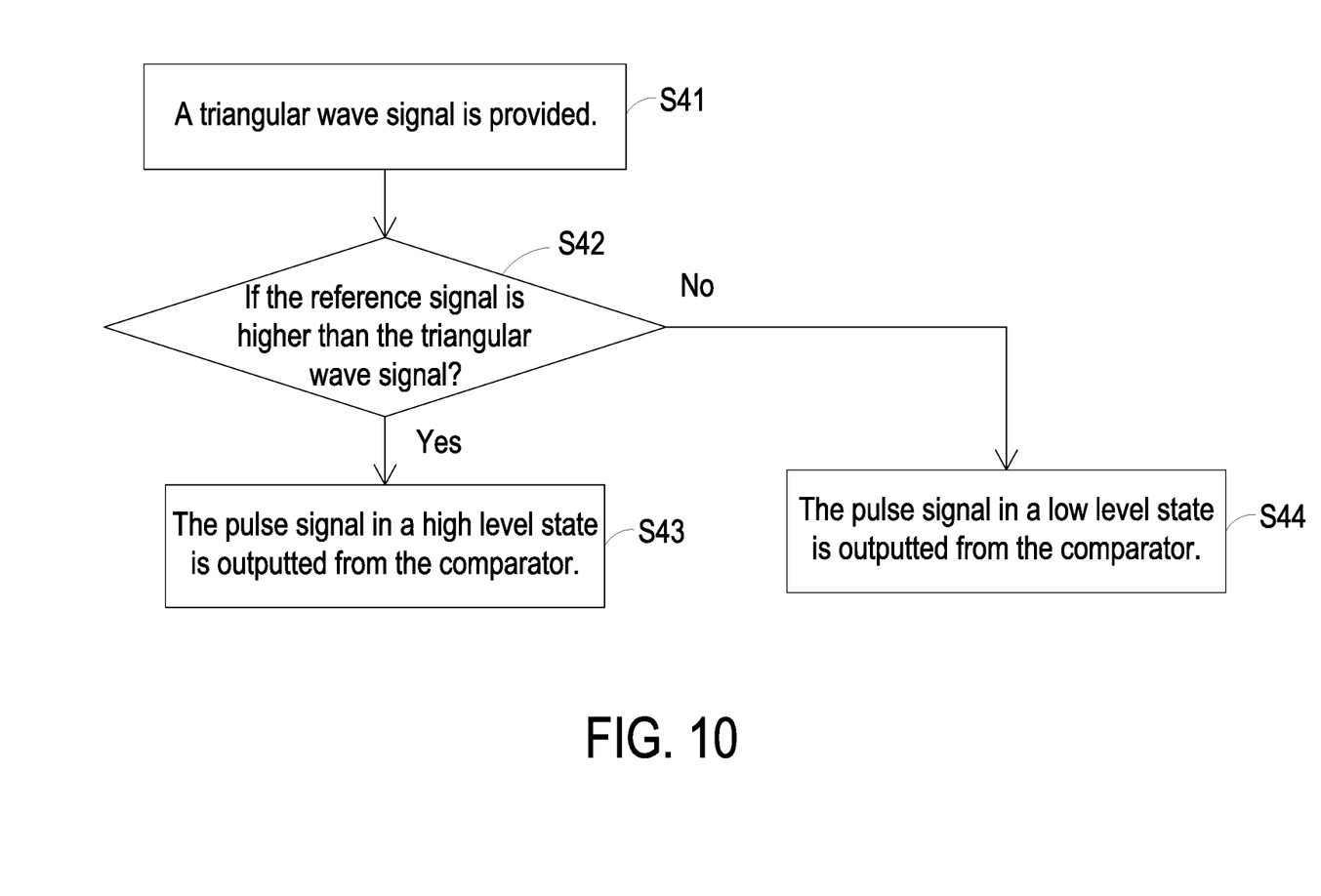
FIG. 10 is a flowchart illustrating the step S4 of the control method of FIG. 9.

FIG. 10 is a flowchart illustrating the step S4 of the control method of FIG. 9. The step S4 comprises the following sub-steps. In a sub-step S41, a triangular wave signal B is provided by the triangular wave generator 114. Then, in a sub-step S42, the comparator 110 judges whether the voltage level of the reference signal A is higher than the voltage level of the triangular wave signal B. If the voltage level of the reference signal A is higher than the voltage level of the triangular wave signal B, the pulse signal C in a high level state is outputted from the comparator 110 to the semiconductor amplifier 12 (Sub-step S43) and the step S5 is performed. If the voltage level of the triangular wave signal B is higher than the voltage level of the reference signal A, the pulse signal C in a low level state is outputted from the comparator 110 to the semiconductor amplifier 12 (Sub-step S44) and the step S5 is performed.

Figure 11:
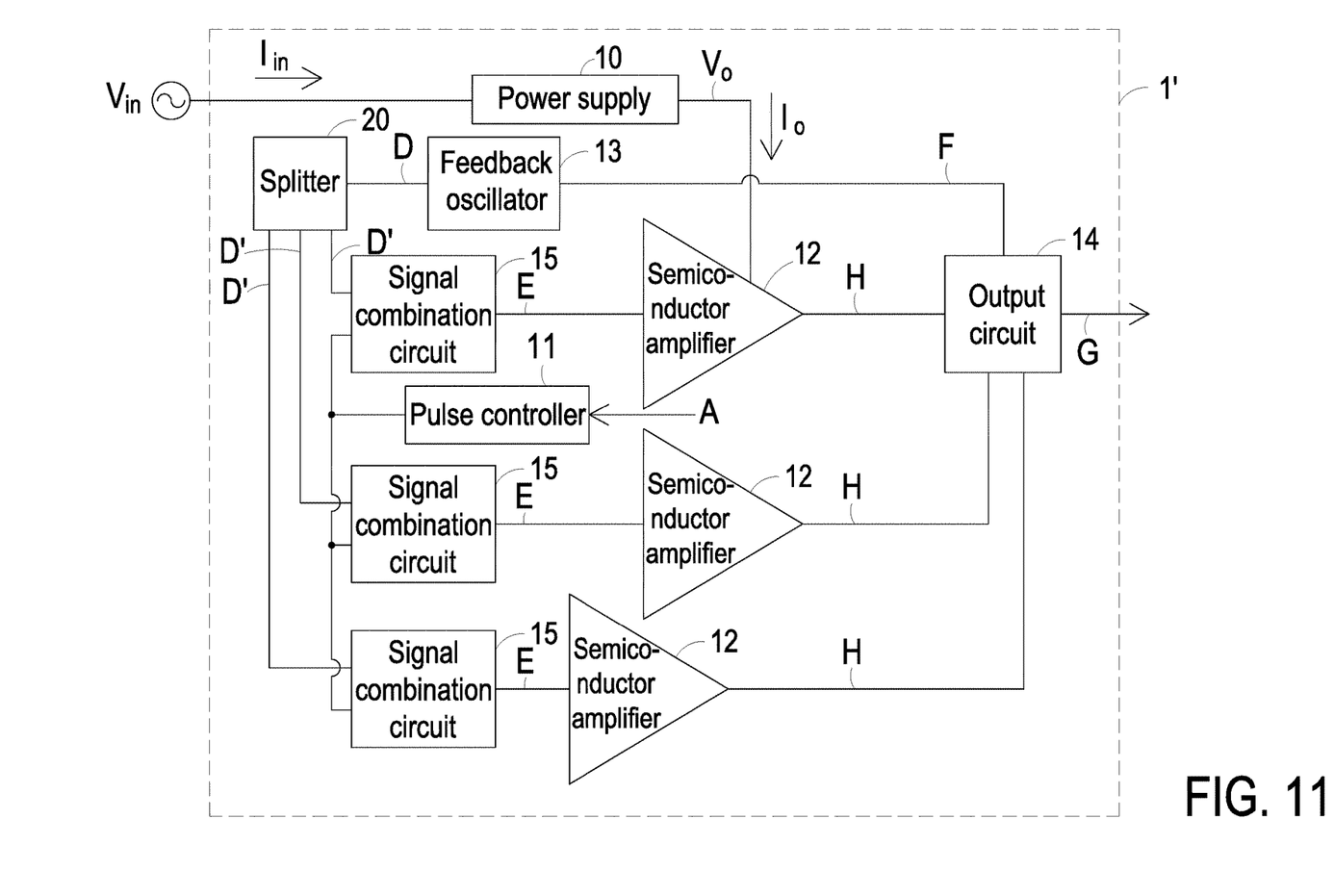
FIG. 11 is a schematic circuit block diagram illustrating the architecture of a microwave generator according to a second embodiment of the present invention.

FIG. 11 is a schematic circuit block diagram illustrating the architecture of a microwave generator according to a second embodiment of the present invention. Component parts and elements corresponding to those of the first embodiment are designated by identical numeral references, and detailed descriptions thereof are omitted. In the first embodiment of FIG. 1, the microwave generator 1 comprises a single semiconductor amplifier 12. In comparison with the first embodiment, the microwave generator 1' of this embodiment comprises plural semiconductor amplifiers 12. Moreover, the microwave generator 1' further comprises a splitter 20 and plural signal combination circuits 15. Each semiconductor amplifier 12 is electrically connected with the power supply 10, the output circuit 14 and the corresponding signal combination circuit 15. The splitter 20 is electrically connected with the feedback oscillator 13 for receiving the oscillation signal D from the feedback oscillator 13. Moreover, the oscillation signal D is split into plural segmented oscillation signals D'. Each signal combination circuit 15 is electrically connected with the splitter 20 and the pulse controller 11 for receiving the pulse signal C and the corresponding segmented oscillation signal D' from the feedback oscillator 13. After the pulse signal C and the corresponding segmented oscillation signal D' are combined together by the signal combination circuit 15, a control signal E is generated to the corresponding semiconductor amplifier 12. Consequently, each semiconductor amplifier 12 generates and adjusts a corresponding amplified signal H. As shown in FIG. 11, the microwave generator 1' of this embodiment comprises plural semiconductor amplifiers 12 and plural signal combination circuits 15 connected in parallel. Consequently, the output power of the microwave generator 1' can be increased so as to achieve the requirements of high power output. In the embodiment, the microwave signals G is generated by the output circuit 14 according to the amplified signals H from the plural semiconductor amplifiers 12.

From the above description, the present invention provides a microwave generator with a power factor correction function and a control method thereof. The reference signal is related to the input voltage and/or harmonics of the input voltage, and the pulse signal is generated by the pulse controller according to the reference signal. The amplified signal from the semiconductor amplifier is influenced by the pulse signal. Moreover, the microwave signal is outputted from the output circuit according to the amplified signal, and the microwave signal is related with the input voltage. While the output current from the power supply is adjusted according to the amplified signal, the output current is also adjusted according to the input voltage. Since the input current is adjusted according to the output current, the input current and the input voltage are adjusted to be in phase. Even if the power supply of the microwave generator is not equipped with a power factor correction circuit, the power factor correction is achieved. Consequently, the fabricating cost and the volume of the microwave generator are reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A control method for a microwave generator, the microwave generator outputting a microwave signal and comprising a power supply, a pulse controller, an output circuit, a feedback oscillator, a signal combination circuit and a semiconductor amplifier, the control method comprising steps of:
   (a) the power supply converting an input voltage and an input current into an output voltage and an output current, and providing the output voltage and the output current to the semiconductor amplifier;
   (b) the output circuit generating the microwave signal and generating a feedback signal according to the microwave signal;
   (c) the feedback oscillator generating an oscillation signal according to the feedback signal;
   (d) providing a reference signal to the pulse controller, so that the pulse controller generates a pulse signal according to the reference signal, wherein the reference signal is related to the input voltage and/or harmonics of the input voltage;
   (e) the signal combination circuit generating a control signal according to the oscillation signal and the pulse signal; and
   (f) the semiconductor amplifier generating and adjusting an amplified signal according to the control signal, and the output circuit generating the microwave signal according to the amplified signal, wherein the output current is adjusted according to the amplified signal, so that the input current and the input voltage are in phase;
   wherein the pulse controller comprises a triangular wave generator and a comparator, and the step (d) comprises sub-steps:
      (d1) the triangular wave generator generating a triangular wave signal;
      (d2) the comparator judging whether a voltage level of the reference signal is higher than a voltage level of the triangular wave signal;
      (d3) if a judging result of the sub-step (d2) is satisfied, outputting the pulse signal in a high level state from the comparator and subsequently performing the step (e); and
      (d4) if the judging result of the sub-step (d2) is not satisfied, outputting the pulse signal in a low level state from the comparator and subsequently performing the step (e).

2. A microwave generator, comprising:
   a power supply for converting an input voltage and an input current into an output voltage and an output current;
   an output circuit connected with an output terminal of the microwave generator, wherein the output circuit generates a microwave signal to the output terminal and generates a feedback signal according to the microwave signal;
   a feedback oscillator electrically connected with the output circuit, wherein the feedback oscillator generates an oscillation signal according to the feedback signal;
   a pulse controller for receiving a reference signal related to the input voltage and/or harmonics of the input voltage and generating a pulse signal, wherein the pulse controller comprises:
      a triangular wave generator for generating a triangular wave signal; and
      a comparator, wherein a first input terminal of the comparator receives the reference signal, a second input terminal of the comparator is electrically connected with the triangular wave generator to receive the triangular wave signal, and an output terminal of the comparator is electrically connected with a semiconductor amplifier;
   wherein the comparator generates the pulse signal to the semiconductor amplifier according to a result of comparing the reference signal and the triangular wave signal;
   a signal combination circuit for combining the oscillation signal with the pulse signal to generate a control signal; and
   wherein the semiconductor amplifier is electrically connected with the power supply, the signal combination circuit and the output circuit, wherein the semiconductor amplifier receives the output voltage and the output current, generates and adjusts an amplified signal according to the control signal, wherein the output circuit generates the microwave signal according to the amplified signal, and the output current is adjusted according to the amplified signal, so that the input current and the input voltage are in phase.

3. The microwave generator according to claim 1, wherein if a voltage level of the reference signal is higher than a voltage level of the triangular wave signal, the pulse signal in a high level state is outputted from the comparator, wherein if the voltage level of the triangular wave signal is higher than the voltage level of the reference signal, the pulse signal in a low level state is outputted from the comparator.

4. The microwave generator according to claim 1, wherein after a product of the square of the input voltage and a proportion coefficient is divided by a predetermined value, the reference signal is obtained, wherein after the input voltage is rectified by a bridge-type rectifier of the power supply, a rectified voltage is generated, wherein the predetermined value is equal to an average value of the rectified voltage.

5. The microwave generator according to claim 1, wherein the semiconductor amplifier is a lateral diffusion metal oxide semiconductor or a gallium nitride high electron mobility transistor.

6. The microwave generator according to claim 1, wherein the microwave generator is included in a microwave apparatus or a RF wireless apparatus.

7. The microwave generator according to claim 1, wherein the signal combination circuit comprises an AND gate, wherein a first input terminal of the AND gate is electrically connected with the feedback oscillator to receive the oscillation signal, a second input terminal of the AND gate is electrically connected with the pulse controller to receive the pulse signal, and an output terminal of the AND gate is electrically connected with the semiconductor amplifier, wherein after the oscillation signal and the pulse signal are combined together by the AND gate, the control signal is generated to the semiconductor amplifier.

8. The microwave generator according to claim 1, wherein the output circuit comprises a detecting circuit electrically connected with the feedback oscillator and an output terminal of the output circuit for generating the feedback signal according to the microwave signal.

9. A microwave generator, comprising:
  a power supply for converting an input voltage and an input current into an output voltage and an output current;
  an output circuit connected with an output terminal of the microwave generator, wherein the output circuit generates a microwave signal to the output terminal and generates a feedback signal according to the microwave signal;
  a feedback oscillator electrically connected with the output circuit, wherein the feedback oscillator generates an oscillation signal according to the feedback signal;
  a splitter electrically connected with the feedback oscillator for splitting the oscillation signal into plural segmented oscillation signals;
  a pulse controller for receiving a reference signal related to the input voltage and/or harmonics of the input voltage and generating a pulse signal;
    plural signal combination: circuits for combining the corresponding segmented oscillation signal with the pulse signal to generate corresponding control signals; and
    plural semiconductor amplifiers electrically connected with the power supply, the corresponding signal combination circuits and the output circuit, wherein each semiconductor amplifier receives the output voltage and the output current, generates and adjusts a respective amplified signal according to the respective control signal, wherein the output circuit generates the microwave signal according to the respective amplified signals outputted from the plural semiconductor amplifiers, and the output current is adjusted according to the amplified signals outputted from the plural semiconductor amplifiers, so that the input current and the input voltage are in phase.

10. The microwave generator according to claim 9, wherein the pulse controller comprises:
  a triangular wave generator for generating a triangular wave signal; and
  a comparator, wherein a first input terminal of the comparator receives the reference signal, a second input terminal of the comparator is electrically connected with the triangular wave generator to receive the triangular wave signal, and an output terminal of the comparator is electrically connected with the plural semiconductor amplifiers,
  wherein the comparator generates the pulse signal to the plural semiconductor amplifiers according to a result of comparing the reference signal and the triangular wave signal.

11. The microwave generator according to claim 9, wherein each of the plural semiconductor amplifiers is a lateral diffusion metal oxide semiconductor or a gallium nitride high electron mobility transistor.

12. The microwave generator according to claim 9, wherein after a product of the square of the input voltage and a proportion coefficient is divided by a predetermined value, the reference signal is obtained, wherein after the input voltage is rectified by a bridge-type rectifier of the power supply, a rectified voltage is generated, wherein the predetermined value is equal to an average value of the rectified voltage.

* * * * *